(12) United States Patent
Rhee et al.

(10) Patent No.: US 8,368,440 B2
(45) Date of Patent: Feb. 5, 2013

(54) PHASE-LOCKED-LOOP CIRCUIT INCLUDING DIGITALLY-CONTROLLED OSCILLATOR

(75) Inventors: Woogeun Rhee, Beijing (CN); He Rui, Beijing (CN); Xueyi Yu, Beijing (CN); Tae-Young Oh, Seoul (KR); Joo-Sun Choi, Yongin-si (KR); Zhihua Wang, Beijing (CN)

(73) Assignees: Samsung Electronics Co., Ltd., Suwon-si (KR); Tsinghua University, Beijing (CN)

( * ) Notice: Subject to any disclaimer, the term of this patent is extended or adjusted under 35 U.S.C. 154(b) by 0 days.

(21) Appl. No.: 13/291,548

(22) Filed: Nov. 8, 2011

(65) Prior Publication Data

US 2012/0280731 A1    Nov. 8, 2012

(30) Foreign Application Priority Data

May 6, 2011    (KR) .................. 10-2011-0043177

(51) Int. Cl.
    *H03L 7/06*    (2006.01)
(52) U.S. Cl. ...................... 327/156; 327/147
(58) Field of Classification Search .......... 327/147, 327/156
    See application file for complete search history.

(56) References Cited

U.S. PATENT DOCUMENTS

| | | | |
|---|---|---|---|
| 6,381,373 B1* | 4/2002 | Suzuki et al. | 382/263 |
| 6,633,752 B1* | 10/2003 | Hashigaya | 455/296 |
| 6,917,229 B2* | 7/2005 | Cho | 327/158 |
| 7,385,538 B2* | 6/2008 | Riley | 341/143 |
| 7,432,751 B2* | 10/2008 | Fang | 327/156 |
| 7,719,366 B2* | 5/2010 | Tsuda | 331/17 |
| 7,786,811 B2 | 8/2010 | Jin | |
| 8,004,327 B2* | 8/2011 | Hongo | 327/156 |
| 2004/0100313 A1* | 5/2004 | Cho | 327/158 |
| 2009/0010310 A1* | 1/2009 | Rofougaran et al. | 375/135 |
| 2009/0268859 A1 | 10/2009 | Sun et al. | |
| 2010/0213993 A1* | 8/2010 | Hongo | 327/156 |
| 2011/0267130 A1* | 11/2011 | Hinson | 327/334 |

FOREIGN PATENT DOCUMENTS

| | | |
|---|---|---|
| JP | 2009-081740 A | 4/2009 |
| KR | 10-2010-0134786 A | 12/2010 |

OTHER PUBLICATIONS

Staszewski, et al. "All-Digital PLL and Transmitter for Mobile Phones." IEEE Journal of Solid-State Circuits, vol. 40, No. 12, Dec. 2005. pp. 2469-2482.

Yu, et al., "An FIR-Embedded Noise Filtering Method for ΔΣ Fractional-N PLL Clock Generators." IEEE Journal of Solid-State Circuits. vol. 44, No. 9, Sep. 2009. pp. 2426-2436.

(Continued)

*Primary Examiner* — Adam Houston
(74) *Attorney, Agent, or Firm* — Sughrue Mion, PLLC

(57) ABSTRACT

A phase-locked-loop (PLL) circuit is provided. The PLL circuit includes a phase/frequency detector, a digital filter, a digital low pass filter (LPF), a digitally controlled oscillator (DCO), and a frequency divider. The digital LPF performs a low-pass-filtering on least significant bits of first digital data in a digital mode and generates filtered second digital data. The DCO performs a digital-to-analog conversion on the second digital data and most significant bits of the first digital data to generate a first signal, generates an oscillation control signal based on the first signal, and generates an output clock signal oscillating in response to the oscillation control signal.

19 Claims, 10 Drawing Sheets

OTHER PUBLICATIONS

He, et al., "A Low-Cost, Leakage-Insensitive Semi-Digital PLL with Linear Phase Detection and FIR-Embedded Digital Frequency Acquisition." IEEE Asian Solid-State Circuits Conference, 4 pages, Nov. 8-10, 2010. Beijing, China.

Liu et al. "A Latency-Proof Quantization Noise Reduction Method for Digitally-Controlled Ring Oscillators." IEEE. 2010. pp. 97-100.

Hung, et al. "A Leakage-Suppression Technique for Phase-Locked Systems in 65nm CMOS." ISSCC Feb. 11, 2009, Session 23, 3 pages, PLLs and Clocks, 23.6.

Rylyakov, et al., "A Modular All-Digital PLL Architecture Enabling Both 1-to-2GHz and 24-to-32GHz Operation in 65nm CMOS." ISSCC Feb. 6, 2008, 3 pages, Session 28. Non-Volatile Memory & Digital Clocking. 28.6.

Wang, et al., "A Digital Intensive Fractional-N PLL and All-Digital Self-Calibration Schemes." IEEE Journal of Solid-State Circuits. vol. 44, No. 8, Aug. 2009. pp. 2182-2192.

* cited by examiner

PHASE-LOCKED-LOOP CIRCUIT INCLUDING DIGITALLY-CONTROLLED OSCILLATOR

CROSS-REFERENCE TO RELATED APPLICATION

This application claims priority under 35 U.S.C. §119 to Korean Patent Application No. 10-2011-0043177 filed on May 6, 2011, the disclosure of which is hereby incorporated by reference in its entirety.

BACKGROUND

1. Field

Exemplary embodiments of the inventive concept relate to a phase-locked-loop (PLL) circuit, and more particularly, to a PLL circuit including a digital filter.

2. Description of the Related Art

A phase-locked-loop (PLL) circuit may be used to synchronize the frequency of an input clock signal with that of an output clock signal to be used in an internal circuit.

In recent years, a digital-type PLL circuit has widely been employed. However, since the digital-type PLL circuit controls operations digitally, the digital-type PLL circuit has poor jitter noise characteristics.

SUMMARY

Exemplary embodiments of the inventive concept provide a phase-locked loop (PLL) circuit having improved jitter noise characteristics.

Exemplary embodiments of the inventive concept also provide a digitally-controlled oscillator of a PLL circuit having improved jitter noise characteristics.

In accordance with an aspect of one or more exemplary embodiments, there is provided a PLL circuit including a phase/frequency detector (PFD), a digital filter, a digital low pass filter (LPF), a digitally-controlled oscillation (DCO) circuit, and a frequency divider.

The PFD compares phase and frequency of an input signal with those of a feedback signal and generates a first signal. The digital filter performs low-pass-filtering on the first signal in a digital mode and generates first digital data comprising most significant bits (MSBs) and least significant bits (LSBs). The digital LPF filters the LSBs of the first digital data in the digital mode and generates filtered second digital data. The DCO circuit performs a digital-to-analog conversion (DAC) operation on the second digital data and the MSBs of the first digital data to generate a second signal, generates an oscillation control signal based on the first signal, and generates an output clock signal oscillating in response to the oscillation control signal. The frequency divider divides a frequency of the output clock signal and generates the feedback signal.

The DCO circuit may perform the DAC operation using bits of the first digital data as MSBs and bits of the second digital data as LSBs.

The digital LPF may generate a plurality of sets of bits of the second digital data.

The DCO circuit may sum the sets of the bits of the second digital data in an analog mode.

The digital LPF may include a plurality of D-type flip-flops connected in series, delay the LSBs of the first digital data, and generate delayed sets of data.

The DCO circuit may include a DAC circuit, a voltage-to-current conversion (VCC) circuit, and an oscillation circuit.

The DAC circuit may perform the DAC operation on the second digital data and the MSBs of the first digital data, and generate a first voltage signal. The VCC circuit may generate the oscillation control signal based on the first voltage signal. The oscillation circuit may generate the output clock signal oscillating in response to the oscillation control signal.

The DAC circuit may include a first current signal generating circuit, a second current signal generating circuit, and a current source. The first current signal generating circuit may generate an MSB current signal in response to values of bits of the MSBs of the first digital data. The second current signal generating circuit may generate an LSB current signal in response to values of bits of the filtered second digital data. The current source may supply a current corresponding to the MSB current signal added to the LSB current signal.

The second current signal generating circuit may include circuit blocks having a same circuit configuration and provided in a number corresponding to a number of taps of the digital LPF.

The PLL circuit may further include a delta-sigma modulator configured to perform a delta-sigma modulation on the LSBs of the first digital data and provide the modulated bits to the digital LPF.

In accordance with another aspect of the inventive concept, a PLL circuit includes a PFD, a charge pump, an analog LPF, a comparator, a second PFD, a digital filter, a digital LPF, a DCO circuit, and a frequency divider.

The first PFD may compare phase and frequency of an input signal with those of a feedback signal and generate an up signal and a down signal. The charge pump may perform charge and discharge operations in response to the up signal and the down signal, and generate a first pump signal and a second pump signal. The analog LPF may perform a low-pass-filtering on the first and second pump signals and generate a first control voltage and a second control voltage. The comparator may compare the first control signal with the second control voltage and generate a selection signal. The second PFD may compare the phase and frequency of the input signal with those of the feedback signal and generate a comparison output signal. The digital filter may filter the comparison output signal in a digital mode in response to the selection signal and generate first digital data comprising most significant bits (MSBs) and least siginificant bits (LSBs). The digital LPF may perform a low pass filtering operation on the LSBs of the first digital data in the digital mode and generate filtered second digital data. The DCO circuit may perform a digital-to-audio conversion (DAC) operation on the second digital data and the MSBs of the first digital data to generate a first signal, generate an oscillation control signal based on the first signal and the first and second control voltages, and generate an output clock signal oscillating in response to the oscillation control signal. The frequency divider may divide the frequency of the output clock signal and generate the feedback signal.

The DCO circuit may include a DAC circuit, a voltage-to-current conversion circuit, and an oscillation circuit.

The DAC circuit may perform the DAC operation on the second digital data and the MSBs of the first digital data, and generate a first voltage signal. The voltage-to-current conversion circuit may generate the oscillation control signal based on the first voltage, the second control voltage, and the first voltage signal. The oscillation circuit may generate the output clock signal oscillating in response to the oscillation control signal.

The DAC circuit may include a first current signal generating circuit, a second current signal generating circuit, and a current source.

The first current signal generating circuit may generate an MSB current signal in response to values of bits of the MSBs of the first digital data. The second current signal generating circuit may generate an LSB current signal in response to values of bits of the filtered second digital data. The current source may supply current corresponding to the MSB current signal added to the LSB current signal.

The second current signal generating circuit may include circuit blocks having a same circuit configuration and provided in a number corresponding to a number of taps of the digital LPF.

The VCC circuit may generate a control current by adding a first current corresponding to the first and second control voltages and a second current corresponding to the first voltage signal, and generate the oscillation control signal based on the control current.

In accordance with another aspect of an exemplary embodiment, a digitally-controlled oscillator includes a digital LPF and a DCO unit.

The digital LPF may perform an LPF operation on first digital data in a digital mode and generate filtered second digital data. The DCO unit may perform a DAC operation on the second digital data and MSBs of the first digital data to generate a first signal, generate an oscillation control signal based on the first signal, and generate an output clock signal in response to the oscillation control signal.

A number of the MSBs may be greater than a number of the LSBs.

According to another aspect of an exemplary embodiment, there is provided a method of reducing jitter in a phase locked loop (PLL) circuit comprising a phase/frequency detector, a digital filter, a digital low pass filter (LPF), a digitally controlled oscillator, and a frequency divider, the method comprising digitally filtering an output of the phase/frequency detector to produce most significant bits (MSBs) and least significant bits (LSBs); digitally low pass filtering only the LSBs; and controlling the digitally controlled oscillator based on the MSBs and the low pass filtered LSBs to produce a clock output with reduced jitter.

Aspects of the inventive concept should not be limited by the above description, and other unmentioned aspects will be clearly understood by one of ordinary skill in the art from example embodiments described herein.

BRIEF DESCRIPTION OF THE DRAWINGS

The above and other aspects will be apparent from the more particular description of exemplary embodiments, as illustrated in the accompanying drawings in which.

DETAILED DESCRIPTION

Figure 1:
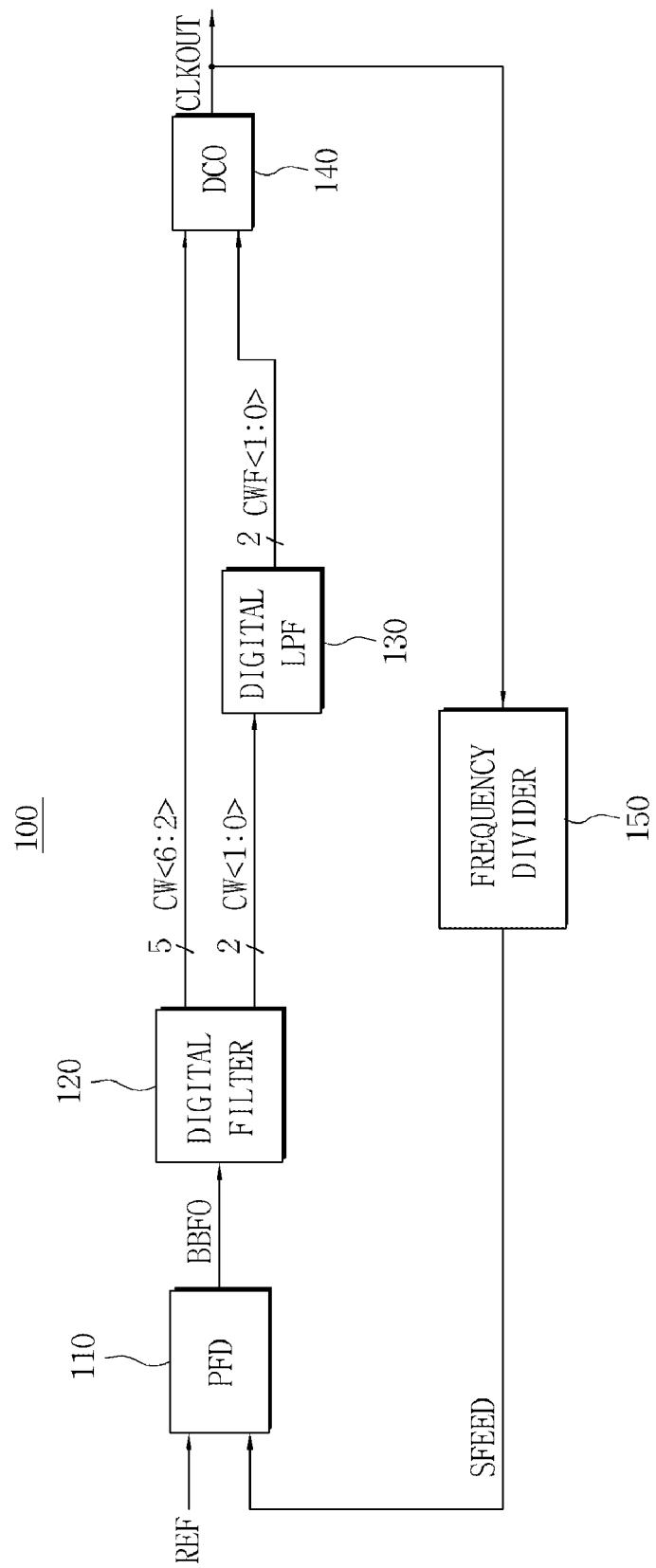
FIG. 1 is a block diagram of a phase-locked-loop (PLL) circuit according to an exemplary embodiment.

Since exemplary embodiments are provided only for structural and functional descriptions, the exemplary embodiments may be embodied in different forms and should not be construed as limited to the exemplary embodiments set forth herein. It should be understood, however, that it is not intended to limit the present inventive concept to the particular forms disclosed, but on the contrary, the present inventive concept is to cover all modifications, equivalents, and alternatives falling within the spirit and scope of the present inventive concept as defined by the appended claims.

In this description and the drawings, like reference characters refer to the same parts throughout the different views. The drawings are not necessarily to scale, emphasis instead being placed upon illustrating various exemplary embodiments.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the present inventive concept.

It will be understood that when an element or layer is referred to as being "on", "connected to" or "coupled with" another element or layer, it can be directly on, connected or coupled with the other element or layer or intervening elements or layers may be present. In contrast, when an element is referred to as being "directly on," "directly connected to" or "directly coupled with" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular exemplary embodiments only and is not intended to be limiting of the present inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective functions or steps described in specific blocks may be performed otherwise. That is, the respective functions or steps may be performed in a specified order, substantially at the same time, or in reverse order.

Various exemplary embodiments will now be described more fully with reference to the accompanying drawings in which some exemplary embodiments are shown.

FIG. 1 is a block diagram of a phase-locked-loop (PLL) circuit 100 according to an exemplary embodiment.

Referring to FIG. 1, the PLL circuit 100 may include a phase/frequency detector (PFD) 110, a digital filter 120, a digital low pass filter (LPF) 130, a digitally-controlled oscillation (DCO) circuit 140, and a frequency divider 150.

The PFD 110 may compare the phase and frequency of an input signal REF with the phase and frequency of a feedback signal SFEED and generate a first signal BBFO. The digital filter 120 may filter the first signal BBFO in a digital mode and generate first digital data having most significant bits (MSBs) CW<6:2> and least significant bits (LSBs) CW<1:0>. The digital LPF 130 may perform an LPF operation on the LSBs CW<1:0> of the first digital data in the digital mode and generate filtered second digital data CWF<1:0>. As described below, the second digital data CWF<1:0> may include 8 data sets CWFO<1:0> to CWF7<1:0>. The first digital data is describes as having five MSBs and two LSBs. However, this is only an example.

The DCO circuit 140 may perform a digital-to-analog conversion (DAC) operation on the second digital data CWF<1:0> and the MSBs CW<6:2> of the first digital data to generate a first signal, generate an oscillation control signal based on the first signal, and generate an output clock signal CLKOUT oscillating in response to the oscillation control signal. The frequency divider 150 may divide the frequency of the output clock signal CLKOUT and generate the feedback signal SFEED.

Figure 2:
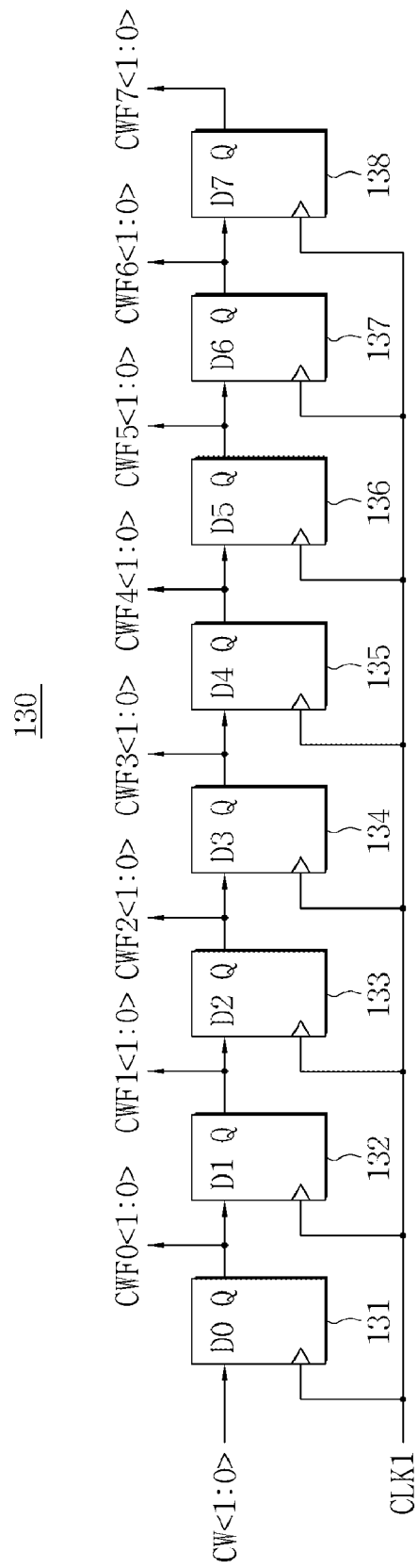
FIG. 2 is a circuit diagram of an example of a digital low-pass-filter (LPF) included in the PLL circuit of FIG. 1.

FIG. 2 is a circuit diagram of an example of the digital LPF 130 included in the PLL circuit of FIG. 1.

Referring to FIG. 2, the digital LPF 130 may include a plurality of D-type flip-flops 131 to 138 connected in series. The digital LPF 130 may delay the LSBs CW<1:0> of the first digital data in response to a clock signal CLK1 and generate delayed data sets CWFO<1:0> to CWF7<1:0>.

As shown in FIG. 2, the second digital data CWF<1:0> may include 8 data sets CWFO<1:0> to CWF7<1:0>.

Figure 3:
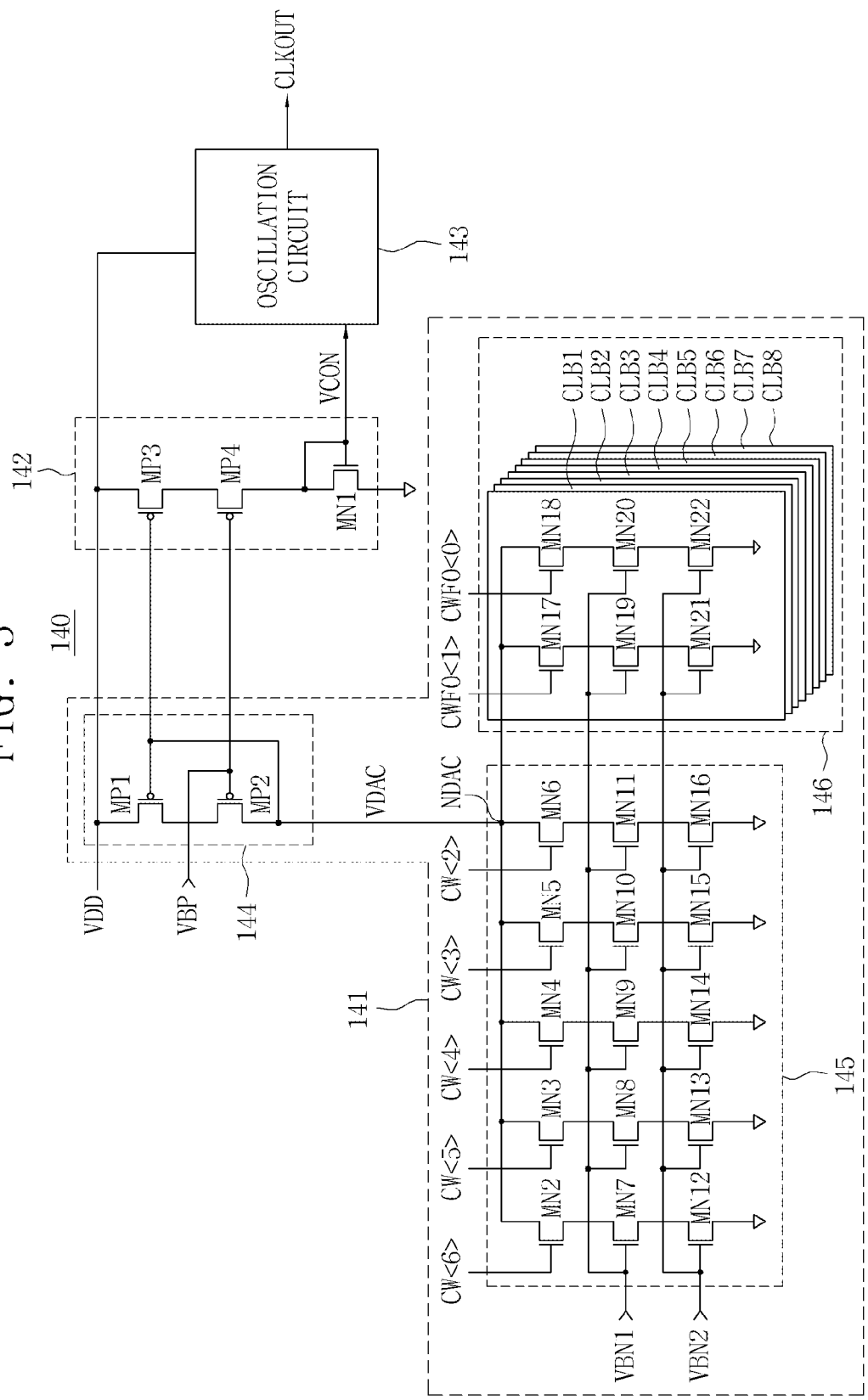
FIG. 3 is a circuit diagram of an example of a digitally-controlled oscillation (DCO) circuit included in the PLL circuit of FIG. 1.

FIG. 3 is a circuit diagram of an example of the DCO circuit 140 included in the PLL circuit 100 of FIG. 1.

Referring to FIG. 3, the DCO circuit 140 may include a DAC circuit 141, a voltage-to-current conversion circuit 142, and an oscillation circuit 143.

The DAC circuit 141 may perform a DAC operation on the second digital data CWFO<1:0> to CWF7<1:0> and the MSBs CW<6:2> of the first digital data, and generate a first voltage signal VDAC. The voltage-to-current conversion circuit 142 may generate an oscillation control signal VCON based on the first voltage signal VDAC, and the oscillation circuit 143 may generate an output clock signal CLKOUT oscillating in response to the oscillation control signal VCON.

The DAC circuit 141 may include a first current signal generating circuit 145, a second current signal generating circuit 146, and a current source 144.

The first current signal generating circuit 145 may generate an MSB current signal in response to values of the MSBs CW<6:2> of the first digital data, and the second current signal generating circuit 146 may generate an LSB current signal in response to values of bits of the second digital data CWFO<1:0> to CWF7<1:0>. The current source 144 may supply current obtained by adding the MSB current signal and the LSB current signal to the first and second current signal generating circuits 145 and 146.

The first current signal generating circuit 145 may include NMOS transistors MN2 to MN16, and the second current signal generating circuit 146 may include NMOS transistors MN17 to MN22. Respective bits of the MSBs CW<6:2> of the first digital data may be applied to gates of the NMOS transistors MN2 to MN6, and respective bits of the second digital data CWFO<1:0> to CWF7<1:0> may be applied to gates of the NMOS transistors (refer to MN17 and MN18 of FIG. 3 and MN23 and MN24 of FIG. 4). A bias voltage VBN1 may be applied to gates of the NMOS transistors of the MSBs (i.e., MN7 to MN11) and gates of the NMOS transistors of the LSBs (refer to MN19 and MN20 of FIG. 3 and MN25 and MN26 of FIG. 4). A bias voltage VBN2 may be applied to gates of the NMOS transistors of the MSBs (i.e., MN12 to MN16) and gates of the NMOS transistors of the LSBs (refer to MN21 and MN22 of FIG. 3 and MN27 and MN28 of FIG. 4).

The current source 144 may include PMOS transistors MP1 and MP2. A drain of the PMOS transistor MP2 may be connected to a gate of the PMOS transistor MP1, and a bias voltage VBP may be applied to a gate of the PMOS transistor MP2. The voltage-to-current conversion circuit 142 may include PMOS transistors MP3 and MP4 and a diode-connected NMOS transistor MN1. A gate of the PMOS transistor MP1 may be connected to a gate of the PMOS transistor MP3, and a gate of the PMOS transistor MP4 may be connected to a gate of the PMOS transistor MP2. A drain of the PMOS transistor MP3 may be connected to a source of the PMOS transistor MP4, and a drain of the PMOS transistor MP4 may be connected to a drain of the diode-connected NMOS transistor MN1.

The sets of bits of the second digital data may be combined in an analog mode as shown in FIG. 3.

Figure 4:
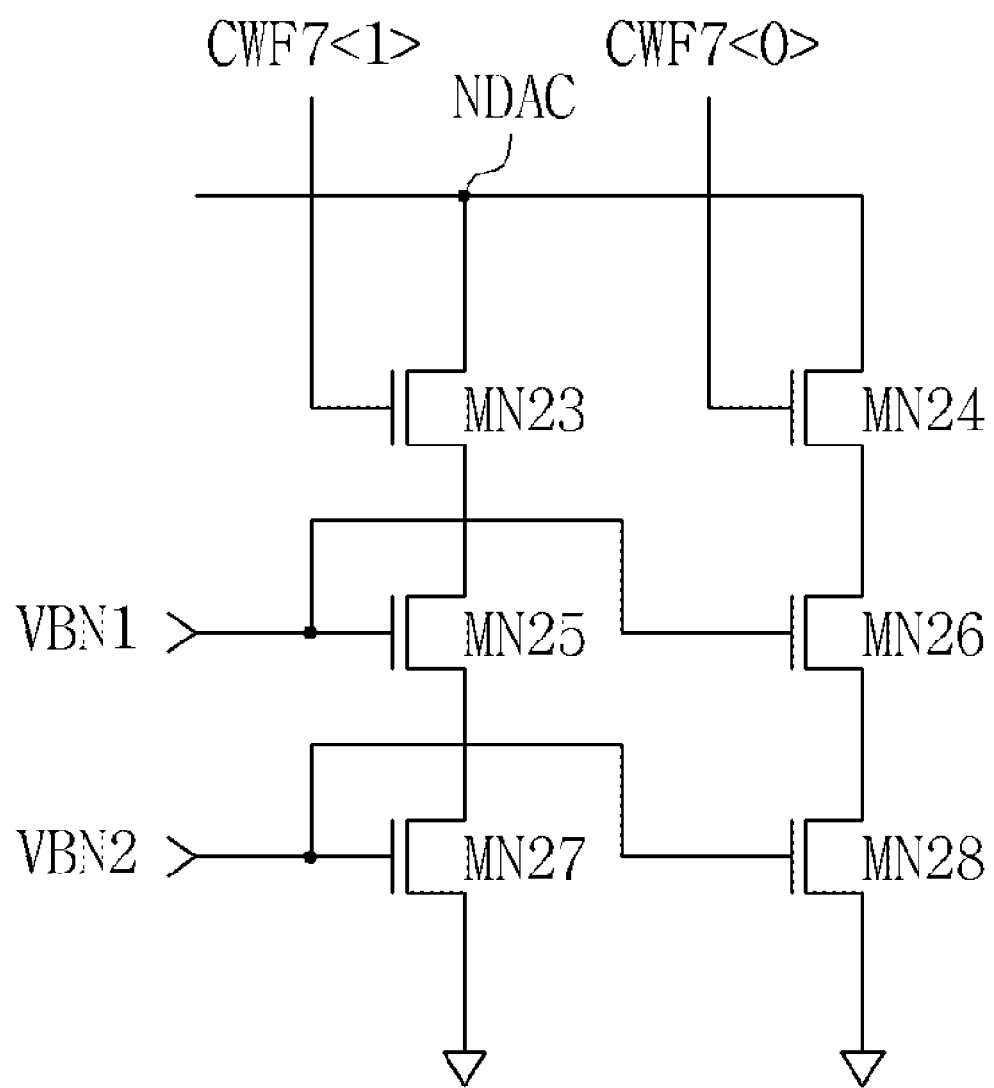
FIG. 4 is a circuit diagram of an example of a block of a second current signal generating circuit included in the DCO circuit of FIG. 3.

FIG. 4 is a construction diagram of one block CLB8 of the second current signal generating circuit 146 included in the DCO circuit 140 of FIG. 3. The block CLB8 may include NMOS transistors MN23 to MN28. Referring to FIGS. 3 and 4, the second current signal generating circuit 146 may include circuit blocks CLB1 to CLB8 having the same circuit configuration. The circuit blocks CLB1 to CLB8 may be provided in a number equal to the number of taps of the digital LPF 130.

Figure 5:
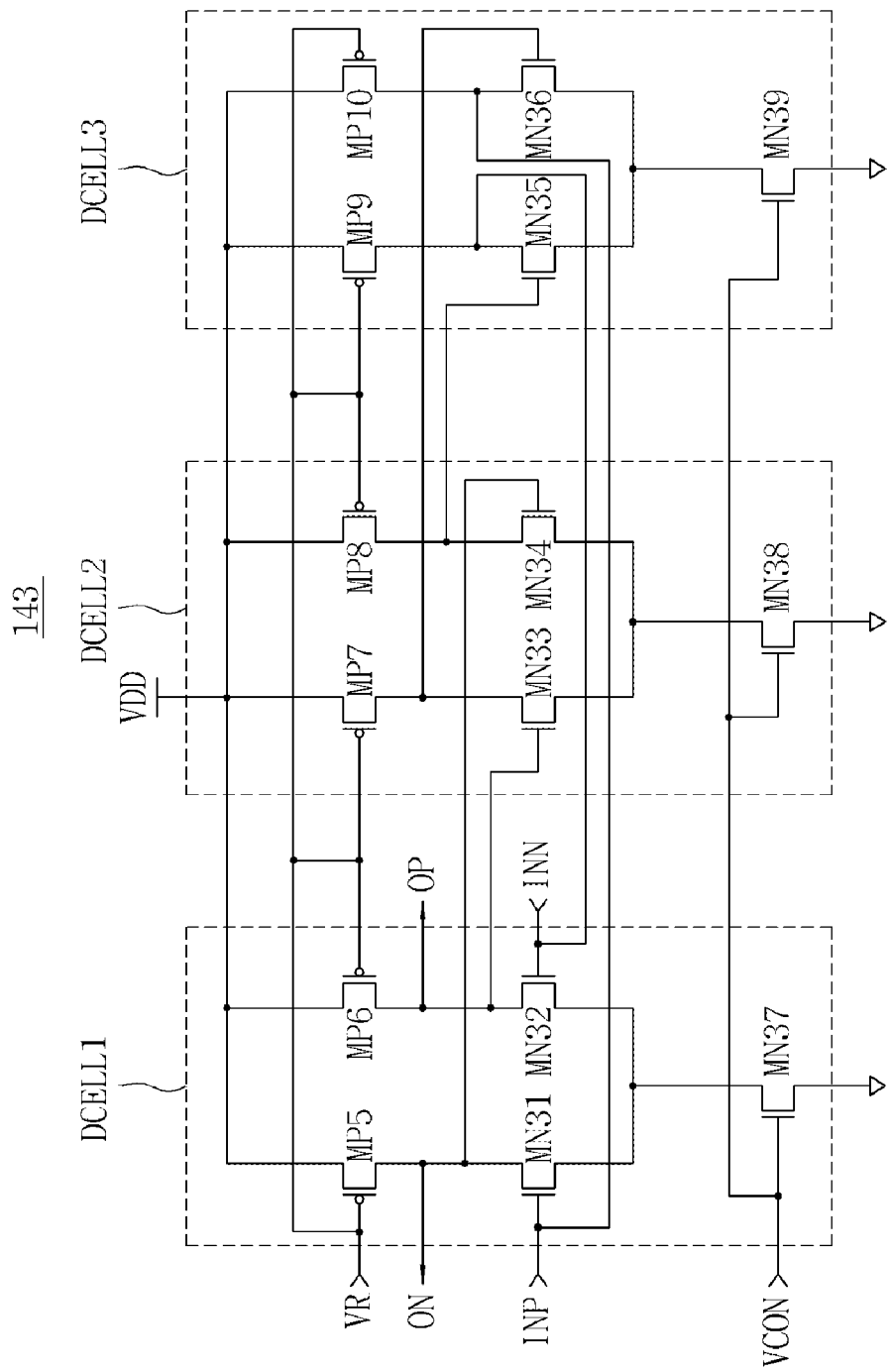
FIG. 5 is a circuit diagram of an example of an oscillation circuit included in the DCO circuit of FIG. 3.

FIG. 5 is a circuit diagram of an example of the oscillation circuit 143 included in the DCO circuit 140 of FIG. 3.

Referring to FIG. 5, the oscillation circuit 143 may include odd delay cells DCELL1 to DCELL3. A front-end delay cell of the delay cells DCELL1 to DCELL3 may have an output terminal connected to an input terminal of a next-end delay cell thereof, and each of the delay cells DCELL1 to DCELL3 may function as an inverter. The first delay cell DCELL1 may include PMOS transistors MP5 and MP6 and NMOS transistors MN31, MN32, and MN37. The second delay cell DCELL2 may include PMOS transistors MP7 and MP8 and NMOS transistors MN33, MN34, and MN38. The third delay cell DCELL3 may include PMOS transistors MP9 and MP10 and NMOS transistors MN35, MN36, and MN39.

Figure 6:
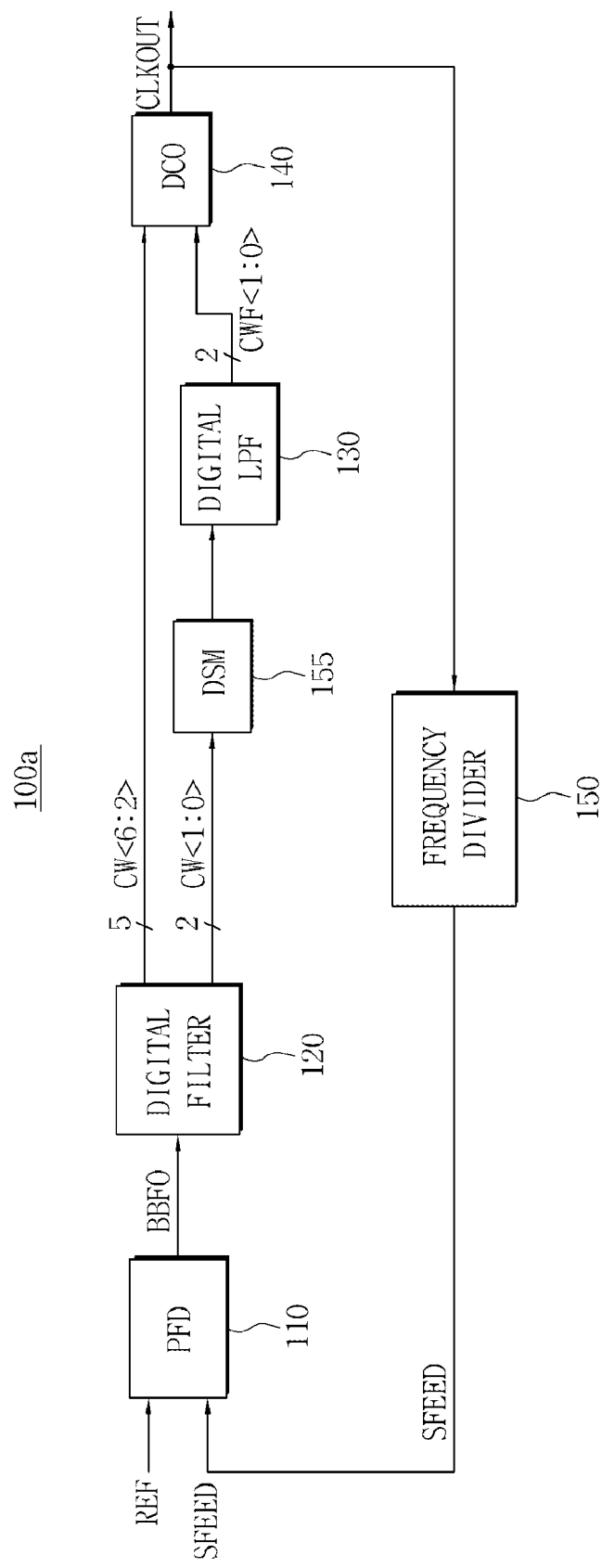
FIG. 6 is a block diagram of a PLL circuit according to another exemplary embodiment.

FIG. 6 is a block diagram of a PLL circuit 100a according to another exemplary embodiment.

Referring to FIG. 6, the PLL circuit 100a may include a PFD 110, a digital filter 120, a digital LPF 130, a DCO circuit 140, a frequency divider 150, and a delta-sigma modulator (DSM) 155.

The PLL circuit 100a is similar to the PPL circuit 100 shown in FIG. 1, except for the DSM 155. The PFD 110 may compare the phase and frequency of an input signal REF with those of a feedback signal SFEED and generate a first signal BBFO. The digital filter 120 may filter the first signal BBFO in a digital mode and generate first digital data having MSBs CW<6:2> and LSBs CW<1:0>. The delta-sigma modulator 155 may perform delta-sigma modulation on the LSBs of the first digital data. The digital LPF 130 may perform an LPF operation on output data of the delta-sigma modulator 155 in the digital mode and generate filtered second digital data CWF<1:0>. The second digital data CWF<1:0> may include 8 data sets CWF0<1:0> to CWF7<1:0>.

The DCO circuit 140 may perform a DAC operation on the second digital data CWF<1:0> and the MSBs CW<6:2> of the first digital data to generate a first signal, generate an oscillation control signal based on the first signal, and generate an output clock signal CLKOUT oscillating in response to the oscillation control signal. The frequency divider 150 may divide the frequency of the output clock signal CLKOUT and generate a feedback signal SFEED.

Figure 7:
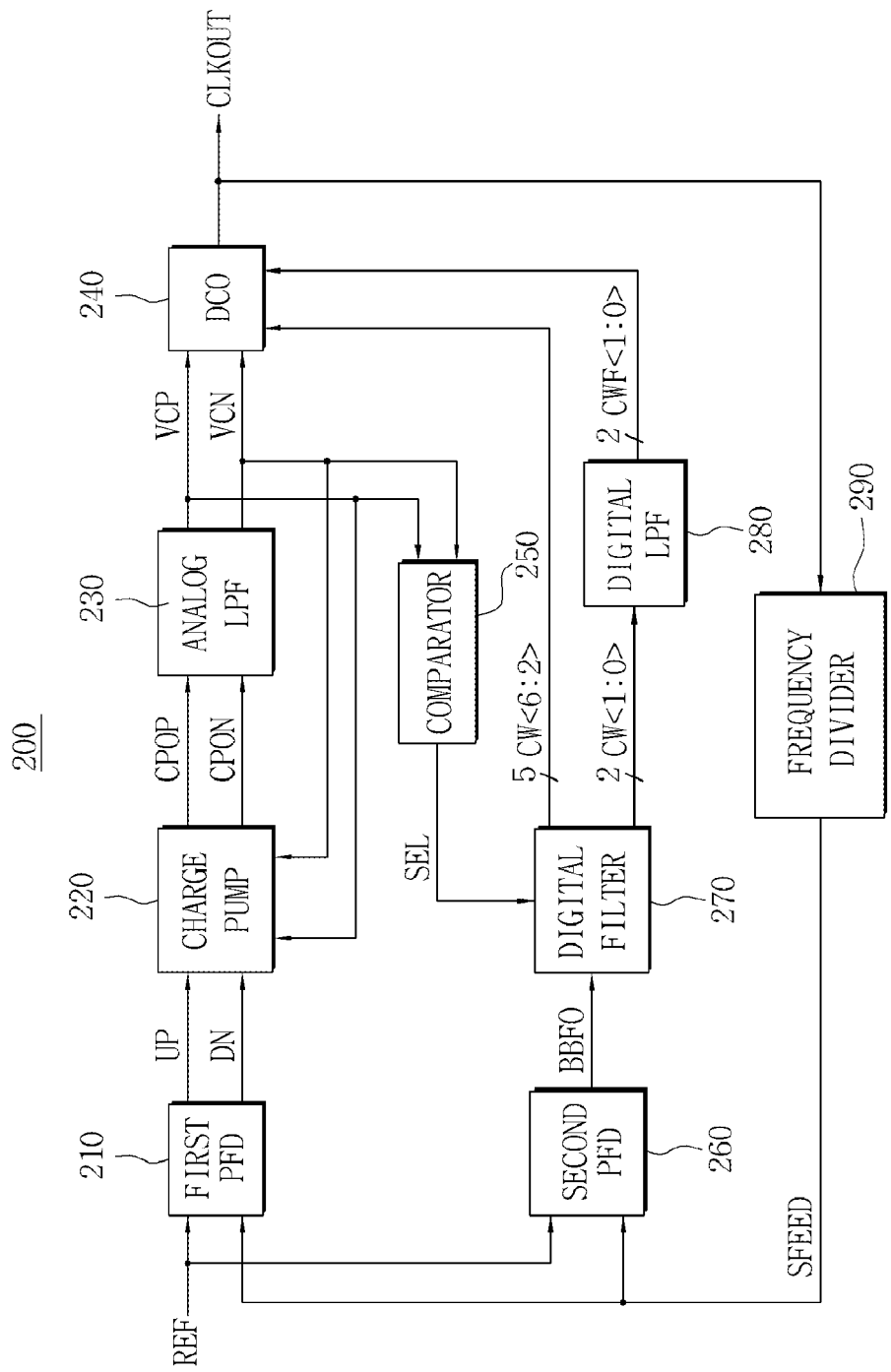
FIG. 7 is a block diagram of a PLL circuit according to another exemplary embodiment.

FIG. 7 is a block diagram of a PLL circuit 200 according to another exemplary embodiment.

Referring to FIG. 7, the PLL circuit 200 may include a first PFD 210, a charge pump 220, an analog LPF 230, a comparator 250, a second PFD 260, a digital filter 270, a digital LPF 280, a DCO circuit 240, and a frequency divider 290.

The first PFD 210 may compare the phase and frequency of an input signal REF with those of a feedback signal SFEED and generate an up signal UP and a down signal DN. The charge pump 220 may perform charge and discharge operations in response to the up signal UP and the down signal DN, and generate a first pump signal CPOP and a second pump signal CPON. The analog LPF 230 may perform an LPF operation on the first pump signal CPOP and the second pump signal CPON and generate a first control voltage VCP and a second control voltage VCN. The comparator 250 may compare the first control voltage VCP with the second control voltage VCN and generate a selection signal SEL.

The second PFD 260 may compare the phase and frequency of the input signal REF with those of the feedback signal SFEED and generate a comparison output signal BBFO. The digital filter 270 may filter the comparison output signal BBFO in a digital mode in response to the selection signal SEL and generate first digital data having MSBs CW<6:2> and LSBs CW<1:0>. The digital LPF 280 may perform an LPF operation on the LSBs CW<1:0> of the first digital data in a digital mode and generate filtered second digital data CWF<1:0>. The DCO circuit 240 may perform a DAC operation on the second digital data CWF<1:0> and the MSBs CW<6:2> of the first digital data to generate a first signal, generate an oscillation control signal based on the first signal, the first control voltage VCP, and the second control voltage VCN, and generate an output clock signal CLKOUT oscillating in response to the oscillation control signal. The frequency divider 290 may divide the frequency of the output clock signal CLKOUT and generate the feedback signal SFEED.

The PLL circuit 200 shown in FIG. 7 may be a combination of a digital path for frequency acquisition, and an analog path for phase tracking.

In FIG. 7, the first PFD 210, the charge pump 220, the analog LPF 230, and the DCO circuit 240 may constitute an analog path, and the second PFD 260, the digital filter 270, the comparator 250, the digitally-controlled LPF 280, and the frequency divider 290 may constitute a digital path.

Figure 8:
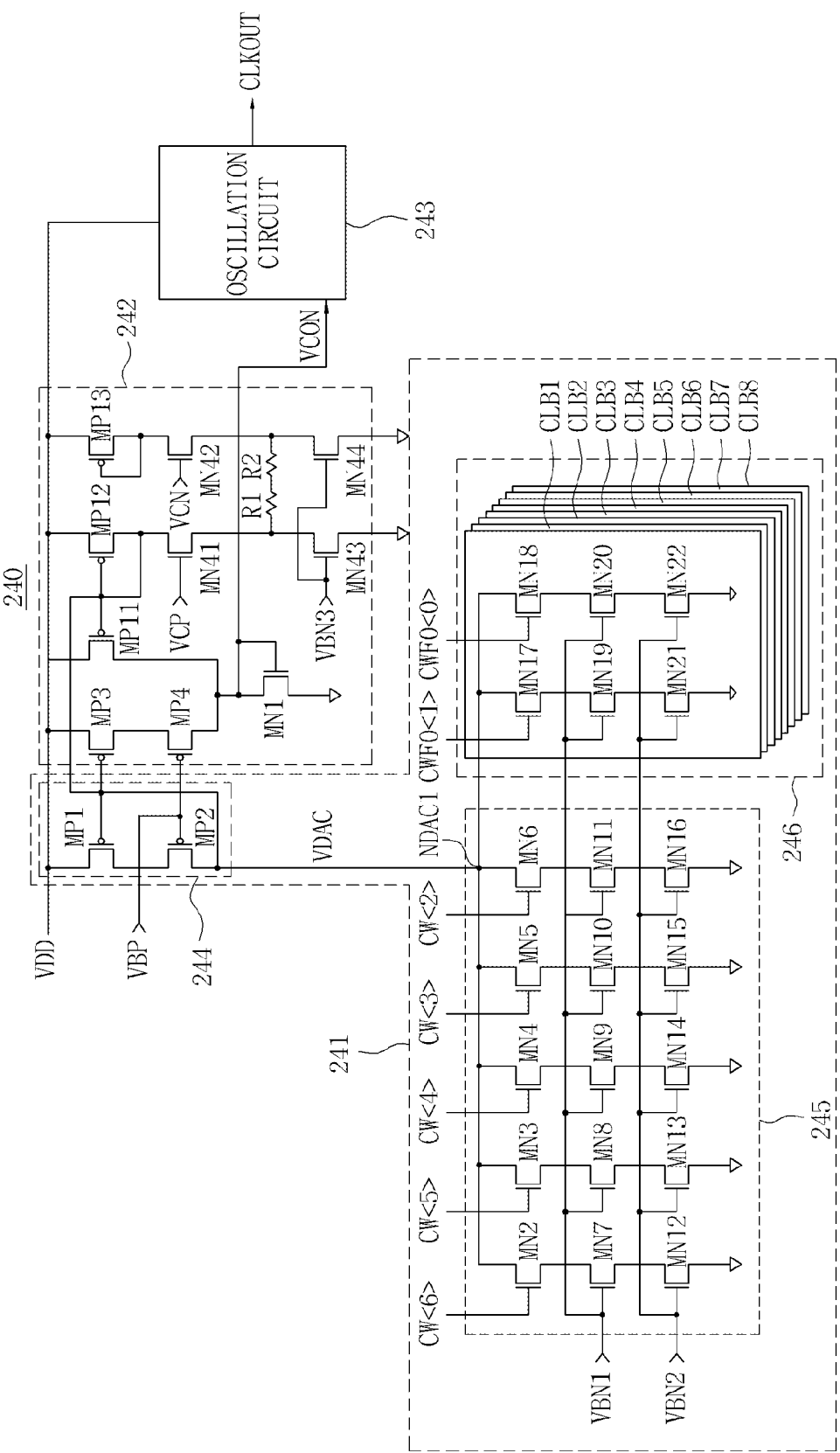
FIG. 8 is a circuit diagram of an example of a DCO circuit included in the PLL circuit of FIG. 7.

FIG. 8 is a circuit diagram of an example of the DCO circuit 240 included in the PLL circuit 200 of FIG. 7.

Referring to FIG. 8, the DCO circuit 240 may include a DAC circuit 241, a voltage-to-current conversion circuit 242, and an oscillation circuit 243.

The DAC circuit 241 may perform a DAC operation on the second digital data CWFO<1:0> to CWF7<1:0> and the MSBs CW<6:2> of the first digital data, and generate a first voltage signal VDAC. The voltage-to-current conversion circuit 242 may generate an oscillation control signal VCON based on the first voltage signal VDAC, the first control voltage VCP, and the second control voltage VCN, and the oscillation circuit 243 may generate an output clock signal CLKOUT oscillating in response to the oscillation control signal VCON.

The DAC circuit 241 may include a first current signal generating circuit 245, a second current signal generating circuit 246, and a current source 244.

The first current signal generating circuit 245 may generate an MSB current signal in response to values of the MSBs CW<6:2> of the first digital data, and the second current signal generating circuit 246 may generate an LSB current signal in response to values of bits of the second digital data CWFO<1:0> to CWF7<1:0>. The current source 244 may supply current obtained by adding the MSB current signal and the LSB current signal.

The voltage-to-current conversion circuit 242 may include PMOS transistors MP3, MP4, MP11, MP12, and MP13, NMOS transistors MN1, MN41, MN42, MN43, and MN44, and resistors R1 and R2.

Figure 9:
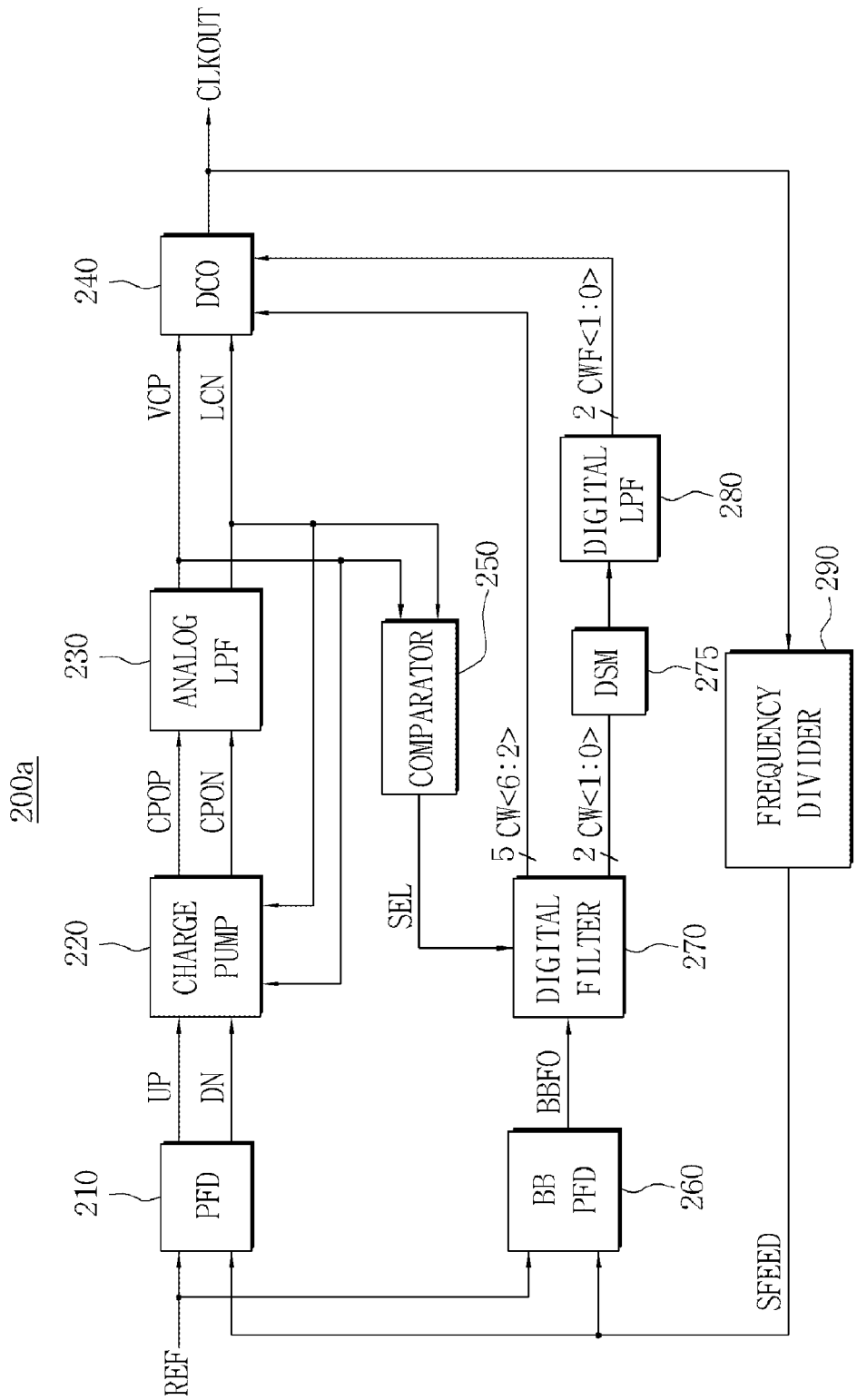
FIG. 9 is a block diagram of a PLL circuit according to another exemplary embodiment.

FIG. 9 is a block diagram of a PLL circuit 200a according to another exemplary embodiment.

Referring to FIG. 9, the PLL circuit 200a may include a first PFD 210, a charge pump 220, an analog LPF 230, a comparator 250, a second PFD 260, a digital filter 270, a delta-sigma modulator (DSM) 275, a digital LPF 280, a DCO circuit 240, and a frequency divider 290.

The PLL circuit 200a of FIG. 9 may have a similar circuit configuration to the PLL circuit 200 of FIG. 8 except that an output signal of the digital filter 270 is delta-sigma-modulated by the DSM 275 and input to the digital LPF 280. Accordingly, a description of operation of the PLL circuit 200a of FIG. 9 is omitted.

Figure 10:
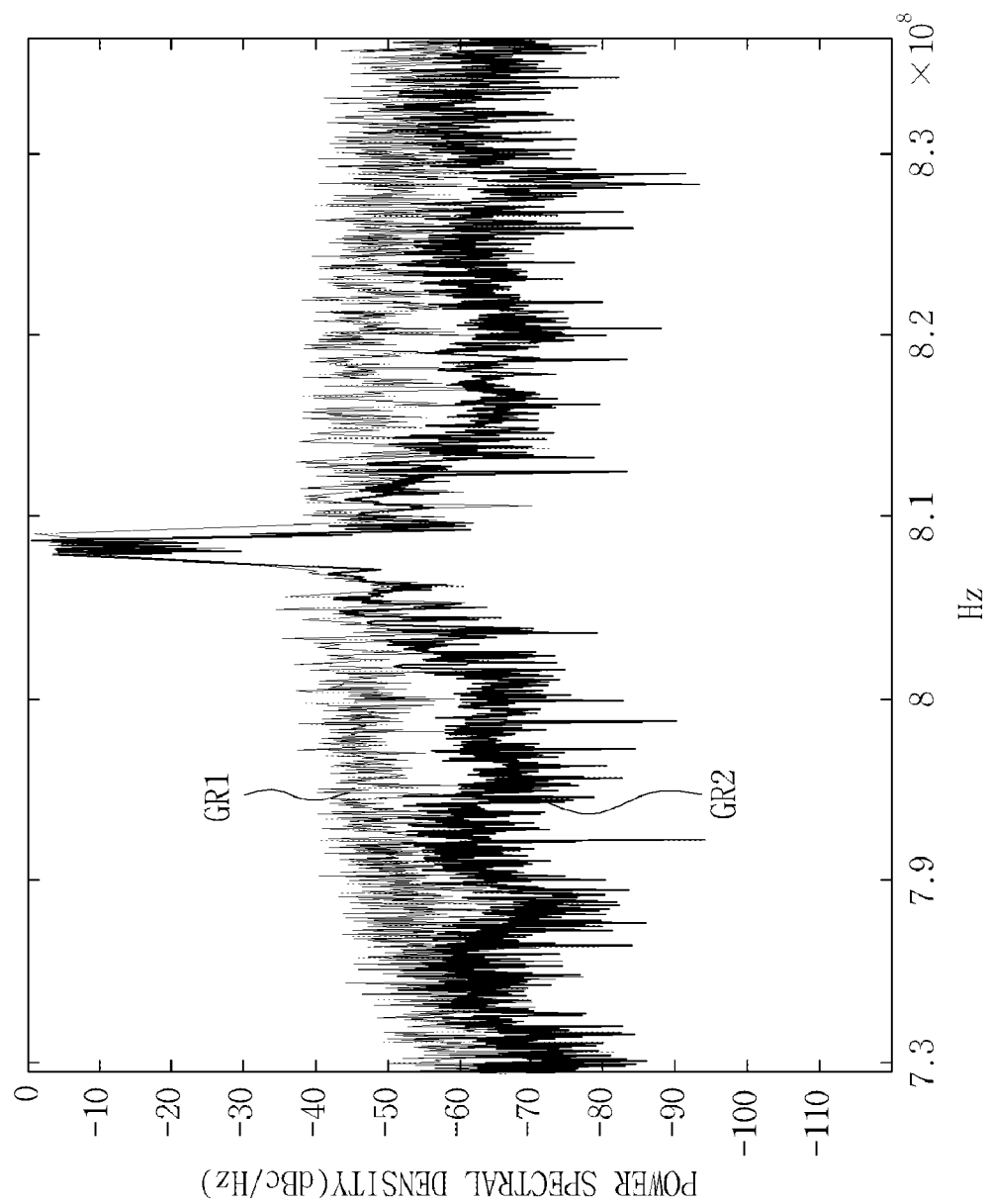
FIG. 10 is a graph showing simulation results of a PLL circuit including a digital LPF disposed at a front end of a DCO circuit according to exemplary embodiments.

FIG. 10 is a graph showing simulation results of a PLL circuit including a digital LPF disposed at a front end of a DCO circuit according to exemplary embodiments.

In FIG. 10, curve GR1 denotes the spectral density of a related art digital PLL circuit in which a digital LPF is not disposed at a front end of a DCO circuit, and curve GR2 denotes the spectral density of a digitally-controlled PLL circuit including a digital LPF disposed at a front end of a DCO circuit according to exemplary embodiments of the present inventive concept. Referring to FIG. 10, a desired signal is obtained at a frequency of about $8.1 \times 10^8$ Hz, and jitter noise fluctuates around a frequency of $8.1 \times 10^8$ Hz.

As shown in FIG. 10, it can be seen that the digital PLL circuit including the digital LPF disposed at the front end of the DCO circuit according to exemplary embodiments cause less jitter noise than the related art digital PLL circuit in which the digital LPF is not disposed at the front end of the DCO circuit.

As explained thus far, since a digital PLL circuit according to exemplary embodiments includes a digital LPF disposed at a front end of a DCO circuit, jitter noise caused by the quantization of a control value of the DCO circuit may be reduced.

A PLL circuit including a digitally-controlled oscillator according to exemplary embodiments of the inventive concept can reduce jitter noise, thereby improving jitter noise characteristics.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel and non-obvious teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other embodiments, are intended to be included within the scope of the appended claims.

What is claimed is:

1. A phase-locked loop (PLL) circuit comprising:
   a phase/frequency detector (PFD) configured to compare phase and frequency of an input signal with those of a feedback signal and generate a first signal;
   a digital filter configured to filter the first signal in a digital mode and generate first digital data comprising most significant bits (MSBs) and least significant bits (LSBs);
   a digital low pass filter (LPF) configured to a perform low-pass-filtering on the LSBs of the first digital data in the digital mode and generate filtered second digital data;
   a digitally-controlled oscillation (DCO) circuit configured to perform a digital-to-analog conversion (DAC) operation on the second digital data and the MSBs of the first digital data to generate a second signal, generate an oscillation control signal based on the second signal, and generate an output clock signal oscillating in response to the oscillation control signal; and
   a frequency divider configured to divide a frequency of the output clock signal to generate the feedback signal.

2. The PLL circuit of claim 1, wherein the DCO circuit performs the DAC operation using bits of the first digital data as MSBs and bits of the second digital data as LSBs.

3. The PLL circuit of claim 1, wherein the digital LPF generates a plurality of sets of bits of the second digital data.

4. The PLL circuit of claim 3, wherein the DCO circuit sums the sets of the bits of the second digital data in an analog mode.

5. The PLL circuit of claim 1, wherein the digital LPF comprises a plurality of D-type flip-flops connected in series, and delays the LSBs of the first digital data to generate delayed sets of data.

6. The PLL circuit of claim 1, wherein the DCO circuit comprises:
   a DAC circuit configured to perform the DAC operation on the second digital data and the MSBs of the first digital data to generate a first voltage signal;
   a voltage-to-current conversion circuit configured to generate the oscillation control signal based on the first voltage signal; and
   an oscillation circuit configured to generate the output clock signal oscillating in response to the oscillation control signal.

7. The PLL circuit of claim 6, wherein the DAC circuit comprises:
   a first current signal generating circuit configured to generate an MSB current signal in response to values of bits of the MSBs of the first digital data;
   a second current signal generating circuit configured to generate an LSB current signal in response to values of bits of the filtered second digital data; and
   a current source configured to supply a current corresponding to the MSB current signal added to the LSB current signal.

8. The PLL circuit of claim 7, wherein the second current signal generating circuit includes circuit blocks having a same circuit configuration and provided in a number corresponding to a number of taps of the digital LPF.

9. The PLL circuit of claim 1, further comprising a delta-sigma modulator configured to perform a delta-sigma modulation on the LSBs of the first digital data, and provide the modulated bits to the digital LPF.

10. The PLL circuit of claim 1, wherein a number of the MSBs is greater than a number of the LSBs.

11. A phase-locked-loop (PLL) circuit comprising:
   a first phase/frequency detector (PFD) configured to compare phase and frequency of an input signal with those of a feedback signal to generate an up signal and a down signal;
   a charge pump configured to perform charge and discharge operations in response to the up signal and the down signal to generate a first pump signal and a second pump signal;
   an analog low pass filter (LPF) configured to perform analog low-pass-filtering on the first and second pump signals to generate a first control voltage and a second control voltage;
   a comparator configured to compare the first control signal with the second control voltage to generate a selection signal;
   a second PFD configured to compare the phase and frequency of the input signal with those of the feedback signal to generate a comparison output signal;
   a digital filter configured to filter the comparison output signal in a digital mode in response to the selection signal to generate first digital data comprising most significant bits (MSBs) and least significant bits (LSBs);
   a digital LPF configured to perform digital low-pass-filtering on the LSBs of the first digital data in the digital mode to generate filtered second digital data;
   a digitally-controlled oscillation (DCO) circuit configured to perform a digital-to-audio conversion (DAC) operation on the second digital data and the MSBs of the first digital data to generate a first signal, generate an oscillation control signal based on the first signal and the first and second control voltages, and generate an output clock signal oscillating in response to the oscillation control signal; and
   a frequency divider configured to divide the frequency of the output clock signal to generate the feedback signal.

12. The PLL circuit of claim 11, wherein the DCO circuit comprises:
   a DAC circuit configured to perform the DAC operation on the second digital data and the MSBs of the first digital data to generate a first voltage signal;
   a voltage-to-current conversion circuit configured to generate the oscillation control signal based on the first voltage, the second control voltage, and the first voltage signal; and
   an oscillation circuit configured to generate the output clock signal oscillating in response to the oscillation control signal.

13. The PLL circuit of claim 12, wherein the DAC circuit comprises:
- a first current signal generating circuit configured to generate an MSB current signal in response to values of bits of the MSBs of the first digital data;
- a second current signal generating circuit configured to generate an LSB current signal in response to values of bits of the filtered second digital data; and
- a current source configured to supply current corresponding to the MSB current signal added to the LSB current signal.

14. The PLL circuit of claim 13, wherein the second current signal generating circuit includes circuit blocks having a same circuit configuration and provided in a number corresponding to a number of taps of the digital LPF.

15. The PLL circuit of claim 12, wherein the voltage-to-current conversion circuit generates a control current by adding a first current corresponding to the first and second control voltages and a second current corresponding to the first voltage signal, and generates the oscillation control signal based on the control current.

16. The PLL circuit of claim 11, further comprising a delta-sigma modulator configured to perform delta-sigma modulation on the LSBs of the first digital data, and provide the modulated bits to the digital LPF.

17. The PLL circuit of claim 11, wherein a number of the MSBs is greater than a number of the LSBs.

18. A method of reducing jitter in a phase locked loop (PLL) circuit comprising a phase/frequency detector, a digital filter, a digital low pass filter (LPF), a digitally controlled oscillator, and a frequency divider, the method comprising:
- digitally filtering an output of the phase/frequency detector to produce most significant bits (MSBs) and least significant bits (LSBs);
- digitally low pass filtering only the LSBs; and
- controlling the digitally controlled oscillator based on the MSBs and the low pass filtered LSBs to produce a clock output with reduced jitter.

19. The method of claim 18, wherein a number of the MSBs is greater than a number of the LSBs.

* * * * *